(12) United States Patent
Salehi et al.

(10) Patent No.: US 8,436,636 B2
(45) Date of Patent: May 7, 2013

(54) METHODS AND APPARATUSES FOR TESTING CIRCUIT BOARDS

(75) Inventors: Amir Salehi, San Jose, CA (US); Reese Cutler, Mountain View, CA (US); David Reha, San Jose, CA (US)

(73) Assignee: Apple Inc., Cupertino, CA (US)

( * ) Notice: Subject to any disclaimer, the term of this patent is extended or adjusted under 35 U.S.C. 154(b) by 178 days.

(21) Appl. No.: 11/545,958

(22) Filed: Oct. 10, 2006

(65) Prior Publication Data

US 2008/0084225 A1   Apr. 10, 2008

(51) Int. Cl.
*G01R 31/28*   (2006.01)
*G01R 31/26*   (2006.01)

(52) U.S. Cl.
USPC .................. 324/763.01; 324/762.01

(58) Field of Classification Search .................. 324/754, 324/765, 761–762, 158.1, 754.11, 762.01–762.1, 324/754.01–754.3, 755.01–755.11; 174/260, 174/255, 256
See application file for complete search history.

(56) References Cited

U.S. PATENT DOCUMENTS

| | | | |
|---|---|---|---|
| 4,968,589 A * | 11/1990 | Perry ............................ 430/314 |
| 5,166,602 A * | 11/1992 | Byford et al. ............ 324/755.08 |
| 5,315,241 A | 5/1994 | Ewers |
| 5,446,395 A | 8/1995 | Goto |
| 5,657,139 A | 8/1997 | Hayashi |
| 5,896,037 A * | 4/1999 | Kudla et al. .................... 324/755 |
| 5,963,045 A | 10/1999 | Zink et al. |
| 6,069,482 A * | 5/2000 | Hilton ............................ 324/755 |
| 6,117,707 A | 9/2000 | Badehi |
| 6,250,933 B1 | 6/2001 | Khoury et al. |
| 6,326,553 B1 | 12/2001 | Yim et al. |
| 6,399,896 B1 * | 6/2002 | Downes et al. ............... 174/260 |
| 6,607,941 B2 | 8/2003 | Prabhu et al. |
| 6,750,926 B2 | 6/2004 | Ohgiichi et al. |
| 6,759,865 B1 | 7/2004 | Gu et al. |
| 6,900,655 B2 | 5/2005 | Kumamoto |
| 7,145,357 B2 | 12/2006 | Lee |
| 2003/0178988 A1 | 9/2003 | Kim |
| 2004/0217767 A1 | 11/2004 | DiOrio et al. |
| 2005/0122127 A1 | 6/2005 | Grillette |
| 2005/0179455 A1 | 8/2005 | Cooper et al. |
| 2009/0121736 A1 | 5/2009 | Jenkins et al. |

FOREIGN PATENT DOCUMENTS

| | | |
|---|---|---|
| CN | 1316650 A | 10/2001 |
| CN | 2550772 | 5/2003 |
| CN | 1451097 A | 10/2003 |
| CN | 2831123 | 10/2006 |
| JP | 2003-149296 | 5/2003 |
| WO | 98/18015 A1 | 4/1998 |

\* cited by examiner

*Primary Examiner* — Tung X Nguyen
(74) *Attorney, Agent, or Firm* — Womble Carlyle Sandridge & Rice LLP (57) ABSTRACT

Methods and apparatuses for testing circuit boards having side mounted test pads are described here.
In one aspect of the invention, a test method includes applying test probes to test pads located on at least one side plane of a circuit board. The test method further includes testing components of the circuit board by applying electrical signals to the test pads that are each coupled to at least one of a plurality of conductive members coupled to the circuit board.

20 Claims, 6 Drawing Sheets

METHODS AND APPARATUSES FOR TESTING CIRCUIT BOARDS

FIELD OF THE INVENTION

The invention relates to methods and apparatuses for testing circuit boards.

BACKGROUND OF THE INVENTION

In electronics, circuit boards such as printed circuit boards (PCBs) or main logic boards are used to mechanically support and electrically connect electronic components using conductive pathways, such as traces or members, etched from copper sheets laminated onto a non-conductive substrate. Alternative names are printed wiring board or etched wiring board. Circuit boards can include multiple planes or layers with the traces being routed across one or more of the planes or layers in order to connect electronic components.

After the circuit board is completed, electronic components can be attached to form a functional printed circuit assembly, or printed circuit board assembly (PCBA). In through-hole construction, component leads may be inserted in holes and electrically and mechanically fixed to the board with a molten metal solder, while in surface-mount construction, the components are simply soldered to pads or landings on outer surfaces of the PCB. Examples of electronic components include integrated circuits, transistors, capacitors, and resistors.

After the circuit board is populated, the interconnection between the traces or members and electronic components is typically tested to confirm connection between various components on the circuit board. Testing for correct component installation, electromagnetic compliance, electrostatic discharge issues, and for other purposes may also occur. The conductive traces or members are connected to test pads formed on the top or bottom surface of the circuit board. Typically, testing occurs with an array of probe tips contacting the test pads or test points on the top or bottom surface of the circuit board. Automated testing may occur with the execution of computer based software programs in a manufacturing test process to ensure functionality of electronic components mounted on circuit boards.

Recently, consumer electronic products have become very small. The circuit boards having electronic components internal to the consumer products have also decreased in size. Thus, as consumer products and circuit boards have decreased in size, the test points are restricted to a small surface area on a circuit board having a limited size.

Past testing processes have occurred with test pads or test points located at various regions on the top or bottom surface of the circuit boards. A test machine may have to move the array of probe tips from one region to the next to complete testing for a particular circuit board. The test pads may consume a significant portion of the top or bottom surface needed for mounting electronic components. The area consumed by the test pads increases the potential size of the circuit board and the resulting consumer products.

SUMMARY OF THE DESCRIPTION

Methods and apparatuses for testing circuit boards having side mounted test pads are described here.

In one aspect of the invention, a test method includes applying test probes to test points located on at least one side plane of a circuit board. The test method further includes testing components of the circuit board by applying electrical signals to the test points. The test points are each coupled to at least one of a plurality of conductive members coupled to the circuit board.

In another aspect of the invention, a method for interconnecting at least two separate circuit boards includes coupling interconnect points located on a side plane of a first circuit board to interconnect points located on a side plane of a second circuit board. The coupling provides an electrical contact between the first and second circuit boards.

In another aspect of the invention, a data processing system includes at least one processor, a memory coupled to the processor, a bus coupled to the processor, and a circuit board having at least one of the processor, the memory, and the bus mounted on the circuit board. The circuit board includes a top plane, a bottom plane and a plurality of side planes with at least one side plane having test points to receive test probes.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follow.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention.

Figure 1:
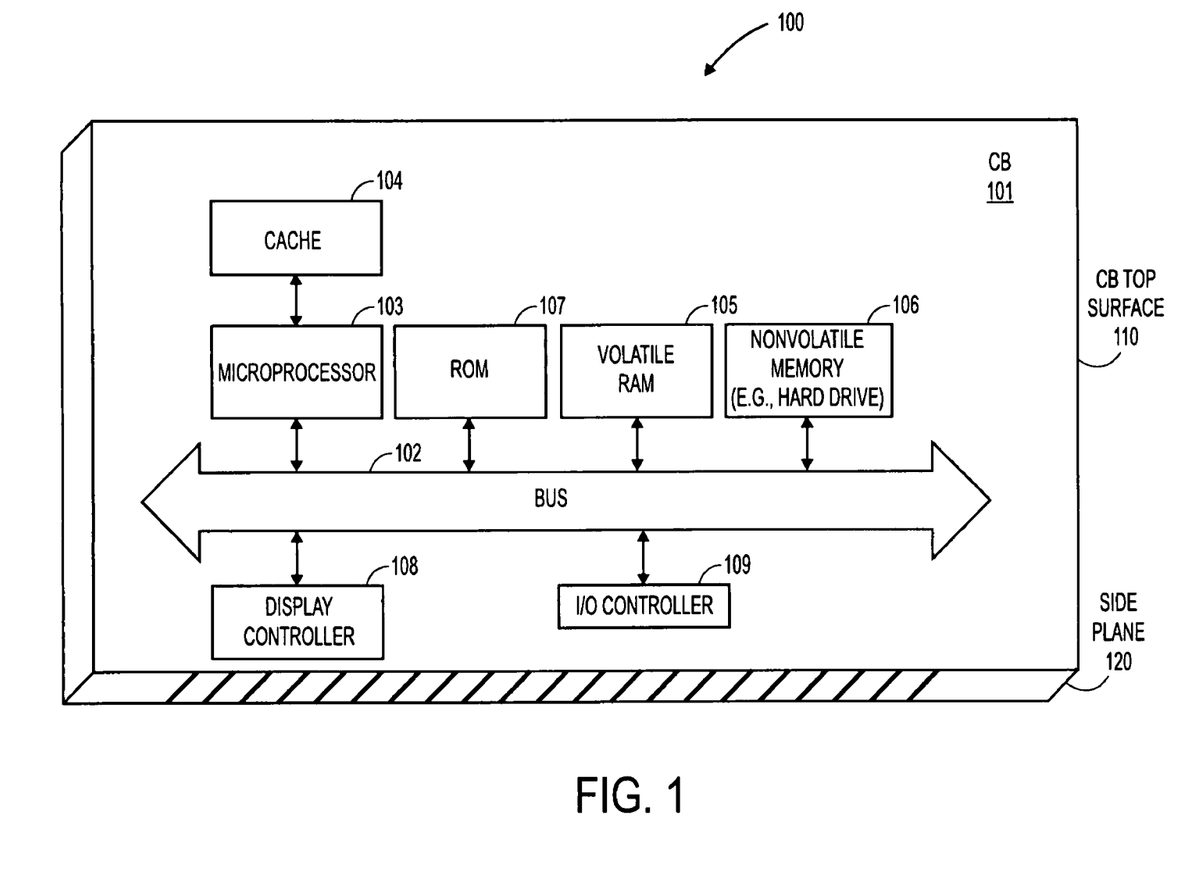
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that embodiments of the inventions may be used with or in personal digital assistants (PDAs), handheld computers, cellular telephones, media players (e.g., an iPod), devices which combine aspects or functions of these devices (e.g., a media player combined with a PDA and a cellular telephone in one device), an embedded processing device within another device, network computers and other data processing systems which have fewer components or perhaps more components than shown in FIG. 1. The computer system of FIG. 1 may, for example, be an Apple Macintosh computer.

As shown in FIG. 1, the computer system 100, which is a form of a data processing system, includes a circuit board (CB) 101 that contains various electronic components including a bus 102 which is coupled to a microprocessor 103 and a ROM 107 and volatile RAM 105 and a non-volatile memory 106. The circuit board 101 may be rigid in certain embodiments or flexible in other embodiments. The microprocessor 103, which may be, for example, a microprocessor from Intel or a G3 or G4 microprocessor from Motorola, Inc. or IBM is coupled to an optional cache memory 104 as shown in the example of FIG. 1. The bus 102 interconnects these various components together and also interconnects these components 103, 107, 105, and 106 to a display controller 108 coupled to display device(s) located external to the CB 101 and to peripheral devices, also external to the CB 101, such as input/output (I/O) devices which may be mice, keyboards, modems, network interfaces, printers, scanners, video cameras and other devices which are well known in the art. The display controller 108 may include one or more frame buffers which are used to refresh display devices or the frame buffers may be in a system RAM (e.g., RAM 105).

Typically, the input/output devices are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

In one embodiment, the data processing system 100 includes a processor or microprocessor 103, a memory or cache memory 104 coupled to the processor 103, a bus 102 coupled to the processor 103, and a CB 101. The processor 103, the memory 104, and the bus 102 are mounted on the circuit board 101 that has a top plane or surface 110, a bottom plane and a plurality of side planes with at least one side plane 120 having test points to receive test probes. The shaded regions of side plane 120 represent a plurality of test points which may resemble the test points 222, 224, 226, and 228 shown in FIG. 2. The CB 101 further includes a plurality of traces or conductive members coupled to the CB 101 with at least one conductive member coupled to each test point. The conductive members are formed on one or more layers or planes of the CB 101. For example, a conductive member may be formed on layers two, five, and six of a ten layer circuit board. The conductive members may also be coupled to one or more electronic components such as the processor 103, the memory 104, and the bus 102. A test apparatus 240 with test probes can test the data processing system 100 by applying the test probes to the test points of the side plane 120 and applying electrical signals to the test points.

Figure 2:
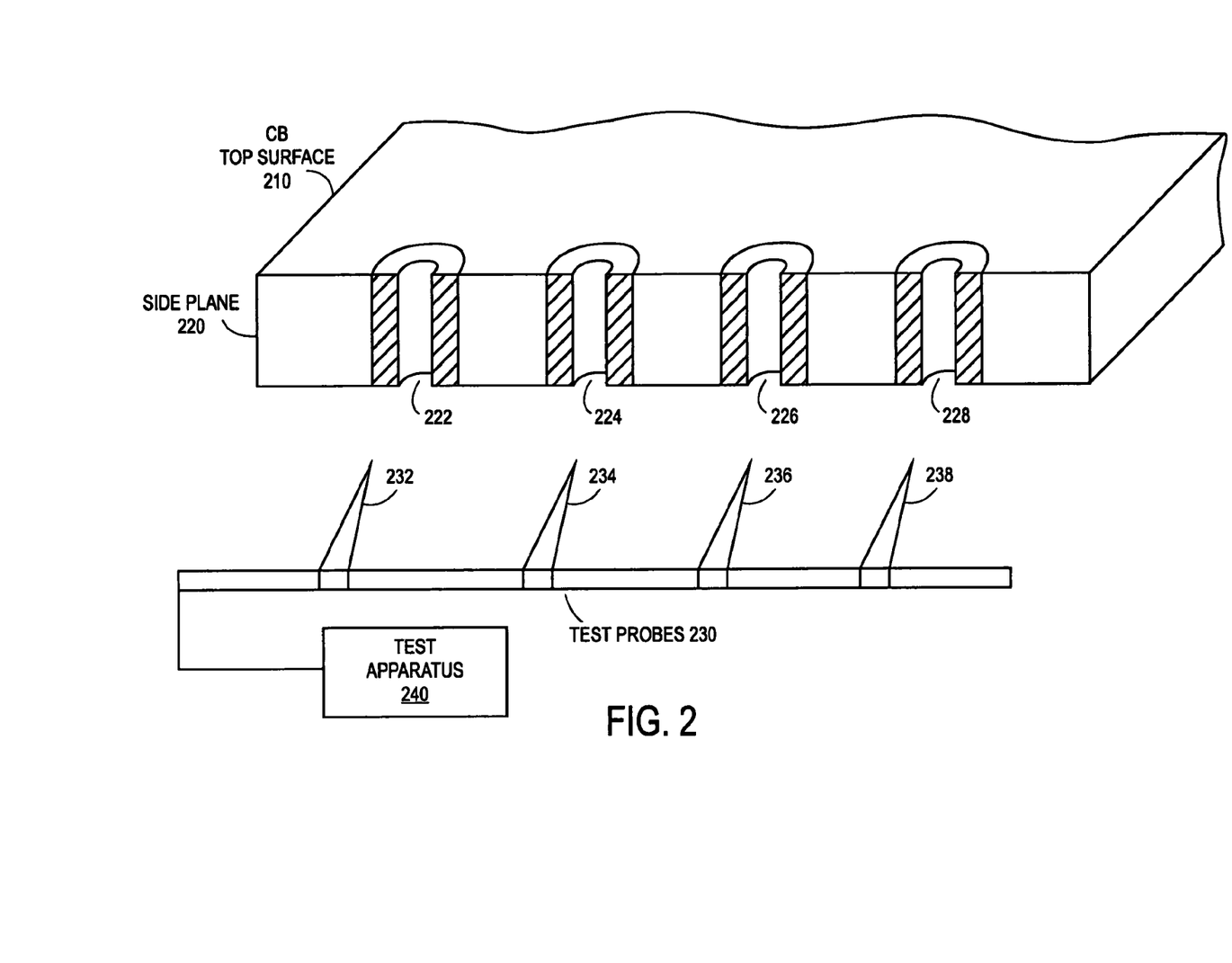
FIG. 2 shows a block diagram example of a test apparatus which may be coupled to a circuit board having side mounted test points according to one embodiment of the present invention.

FIG. 2 shows a block diagram example of a test apparatus which may be coupled to a circuit board having side mounted test points according to one embodiment of the present invention. A test apparatus 240 executes computer based software to test electronic components of the data processing system 100 mounted in CB 101 having a top surface 110, a bottom surface (not shown), and a side plane 120. The CB 101 in FIG. 1 corresponds to the CB 201 having a top surface 210 with the side plane 220 and the test points 222, 224, 226, and 228 shown in detail in FIG. 2. The test apparatus 240 may be electrically coupled to the electronic components of the CB 201 via test probes 230 that are received by the side plane 220 of the CB 201. The side plane 220 has a plurality of test points or test pads 222, 224, 226, and 228 that receive the test probes 232, 234, 236, and 238, respectively directly on the side plane 220. The CB 201 includes a plurality of conductive members or traces (not shown) that connect one or more electronic components on the CB 201 to the test points of the side plane 220. The conductive members or traces are generally embedded within the CB 201 and formed on one or more planes or layers of the CB 201. The conductive members or traces can be formed on the top or bottom surface of the CB 201. However, this would consume the valuable top or bottom surface of the CB 201.

Each embedded member or trace may be protected with a ground shield in order to minimize or eliminate interference or noise between the plurality of members or traces. The ground shield also provides protection from electronic components and other conductive pathways.

In one embodiment, the electronic components of the data processing system 100 can be tested by the test apparatus 240 via the test probes 230 without contacting the top or bottom surface of the CB 201 with the test probes 230. The top surface 210 can be used primarily for mounting electronic components in order to decrease the size of the CB 201. As shown in FIG. 2, a portion of each of the test pads 222, 224, 226, and 228 may be disposed on the top surface 210. Alternatively, increased functionality or enhanced performance can be achieved based on not having any portion of the test pads 222, 224, 226, and 228 on the top surface of the CB 201 such that the entire electrical contact surface for each of these test pads is only on the side plane 220.

In one embodiment, the test points on the side plane 220 and the test probes 230 are both collinear. The test apparatus 240 can test the data processing system 100 in a simple and time efficient manner because of the collinear test points (e.g., 222, 224, 226, and 228) and the test probes 230 (e.g., 232, 234, 236, and 238) compared to moving the test probes 230 across various locations on the top surface 210 of the PCB.

The test points of the circuit board 201 shown on the side plane 220 can be formed in various shapes and locations on the circuit board 201. In one embodiment, the test points are partially recessed from the side plane 220 as illustrated in FIG. 2. The test points can also completely lie in one side plane of the circuit board 101 as illustrated in FIG. 1.

In one embodiment, the test points lie in at least one side plane, the top plane 210, and the bottom plane of the circuit board 201. The increase in the number of test points can improve test performance, yield, and lower manufacturing costs.

Figure 3:
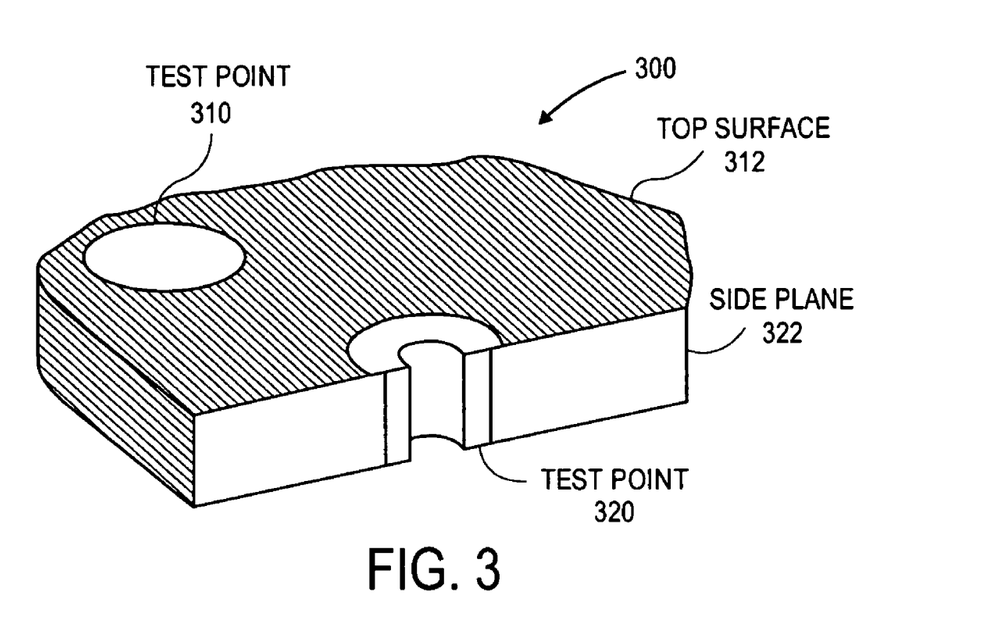
FIG. 3 shows an example of a circuit board having a side mounted test point and a top surface test point according to one embodiment of the present invention.

FIG. 3 shows an example of a circuit board having a side mounted test point and a top surface test point according to one embodiment of the present invention. The circuit board 300 includes a test point 310 on a top surface 312 and a test point 320 mounted on a side plane 322 of the circuit board 300. A plurality of test points 310 can be formed on the top surface 312 of the circuit board 300. Also, a plurality of test points can be formed on the side plane 322 of the circuit board 300.

The efficiency of a testing process may be improved by having the test points 320 on the side plane 322 in addition to the test points 310 on the top surface 312 of the circuit board 300. Improved test performance can improve yield and reduce manufacturing costs. Alternatively, some of the test points 310 on the top surface 312 can be formed on the side plane 322 resulting in a smaller circuit board 300 while maintaining test performance.

Figure 4A:
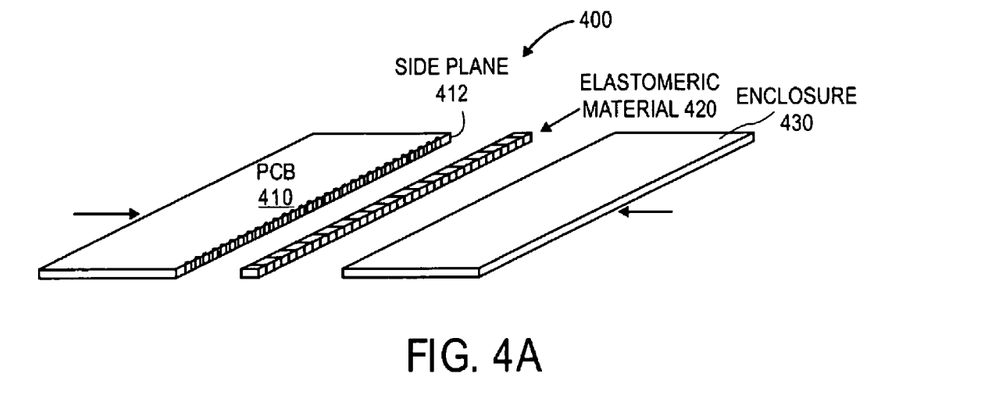
FIG. 4A shows, in a side perspective view, an example of a first printed circuit board coupled to an elastomeric material (or other type of material) which is coupled to an enclosure according to one embodiment of the present invention.

FIG. 4A shows, in a side perspective view, an example of a first printed circuit board coupled to an elastomeric material (or other type of material) which is coupled to an enclosure according to one embodiment of the present invention. In one embodiment, the block diagram 400 includes a printed circuit board (PCB) 410 coupled to an elastomeric material 420 that is coupled to an enclosure 430. In some embodiments, the elastomeric material 420 is any type of flexible or rigid material suitable for coupling the PCB 410 to the enclosure 430.

In one embodiment, test probes (not shown) are located within the enclosure. Thus, the block diagram 400 enables the testing of the PCB 410 having a plurality of test points on a side plane 412 which is coupled to the elastomeric material 420 that is coupled to the enclosure 430. The elastomeric material 420 may be segmented with alternating conductive and non-conductive layers to couple the test points of the side plane 412 to the enclosure 430 which is designed to receive a plurality of test probes. A plurality of conductive layers may contact each test point.

In one embodiment, the electronic components of the data processing system 100 can be tested with the test probes contained in the enclosure 430 without contacting the top or bottom surface of the PCB 410. The top surface of the PCB 410 can be used primarily for electronic components in order to decrease the size of the PCB 410.

Figure 4B:
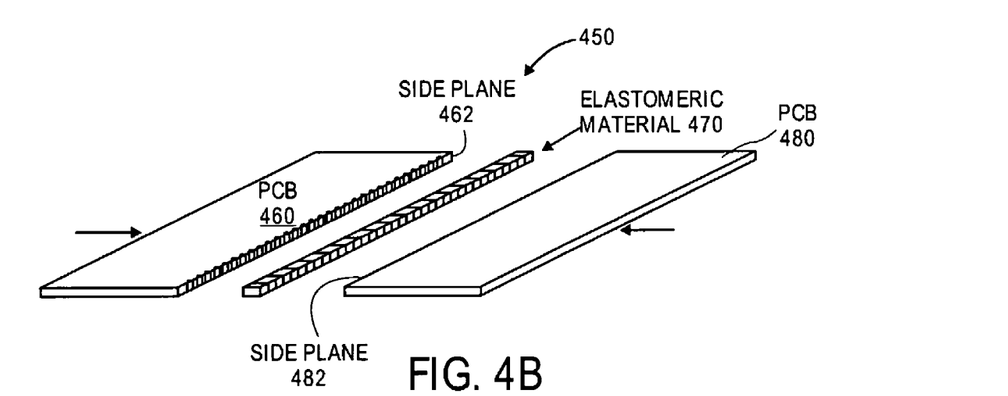
FIG. 4B shows a block diagram example of a first circuit board coupled to an elastomeric material (or other type of material) which is coupled to a second circuit board according to one embodiment of the present invention.

FIG. 4B shows a block diagram example of a first circuit board coupled to an elastomeric material (or other type of material) which is coupled to a second circuit board according to one embodiment of the present invention. In one embodiment, the block diagram 450 includes a printed circuit board (PCB) 460 coupled to an elastomeric material 470 which is coupled to a printed circuit board (PCB) 480. In some embodiments, the elastomeric material 470 is any type of flexible or rigid material suitable for coupling the PCB 460 to the PCB 480.

The PCB 460 includes a top plane, a bottom plane, and a plurality of side planes, with a side plane 462 having interconnect points. The PCB 480 includes a top plane, a bottom plane, and a plurality of side planes, with a side plane 482 having interconnect points.

The elastomeric material 470 is segmented with alternating conductive and non-conductive layers to couple the interconnect points of the side plane 462 to the interconnect points of the side plane 482. A plurality of conductive layers may contact each interconnect point. Thus, the block diagram 450 enables the interconnect of the PCB 460 and the PCB 480 with interconnect points located on the side plane 462 of the PCB 460 and the side plane 482 of the PCB 480. The interconnect points are connected to electronic components contained within PCB 460 and PCB 480 via conductive members or traces. Electronic components of PCB 460 can communicate with electronic components of PCB 480 based on the coupling between interconnect points of the side plane 462 and the side plane 482 that provides an electrical contact between the PCB 460 and the PCB 480.

The conductive members or traces are generally embedded within the PCB 460 and the PCB 480 and formed on one or more layers within the PCB 460 and the PCB 480. The conductive members or traces may be formed on the top or bottom surface of the PCB 460 or the PCB 480. However, this would consume the valuable top or bottom surface of the PCB 460 or the PCB 480.

In one embodiment, the data processing system 100 with the CB 101 corresponds to the PCB 460. The electronic components of the PCB 460 can be coupled to the electronic components of the PCB 480 without contacting the top or bottom surface of either the PCB 460 or the PCB 480. The top surfaces of the PCB 460 and the PCB 480 can be used primarily for electronic components in order to decrease the size of the PCB 460 and the PCB 480.

Figure 5:
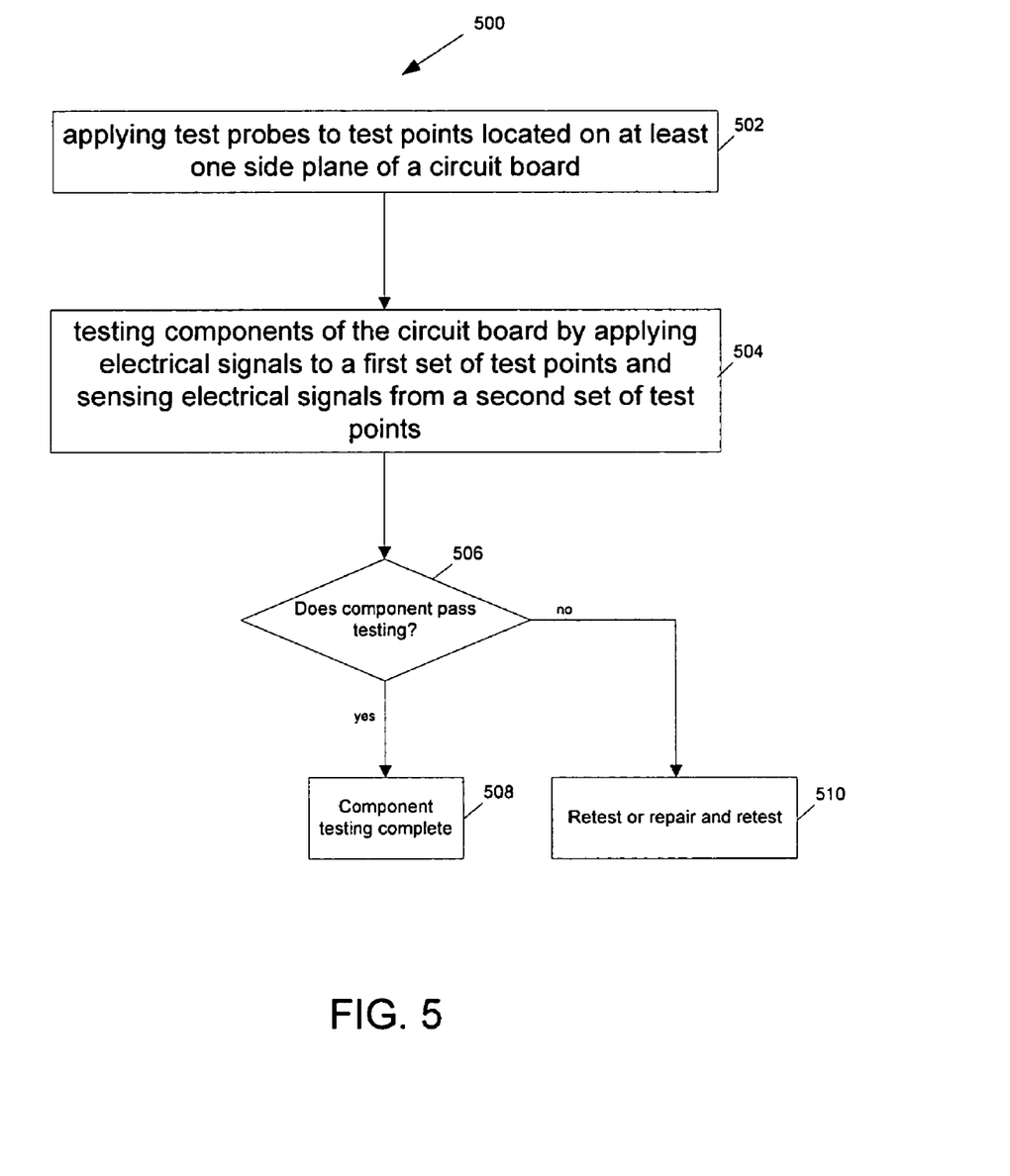
FIG. 5 shows a flow chart for a method to test a circuit board having side mounted test points according to one embodiment of the present invention.

FIG. 5 shows a flow chart for a method to test a circuit board having side mounted test points according to one embodiment of the present invention. The method 500 includes applying test probes to test points located on at least one side plane of the circuit board at block 502. The method 500 further includes testing components of the circuit board by applying electrical signals to a first set of test points and sensing electrical signals from a second set of test points at block 504. The first set of test points may or may not include test points of the second set of test points.

In one embodiment, components are tested by applying electrical signals to the test points without sensing electrical signals from the test points. The test points are each coupled to at least one of a plurality of conductive members coupled to the circuit board. Each component of the circuit board is coupled to at least one of the plurality of conductive members.

The method 500 further includes determining whether the component being tested passes the testing at block 506. The testing is performed by a testing apparatus that may execute computer based software. If the component passes the testing, then the testing apparatus records the component as passing at block 508. If the component fails the testing, then the testing apparatus records the component as failing at block 510 with the component being subject to retest or repair and retest. In one embodiment, repair of the component includes replacing the component with a new component. In another embodiment, repair of the component includes improving the electrical or physical connection between the component and the circuit board.

In one embodiment, components of the circuit board are tested without contacting the top or bottom surface of the circuit board with the test probes. The test probes and the test points on the side plane of the circuit board can be collinear. The test apparatus can test the circuit board in a simple and time efficient manner because of the collinear test points and test probes.

Figure 6:
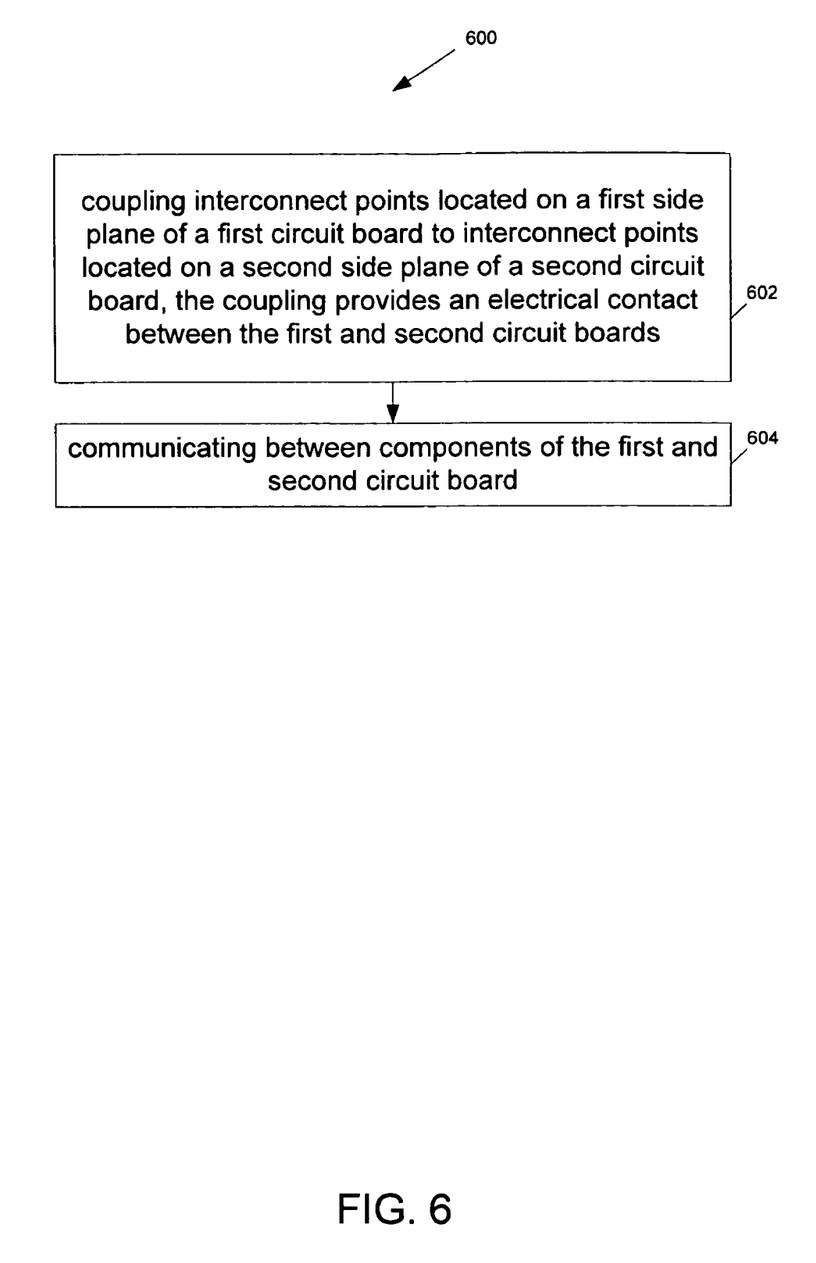
FIG. 6 shows a flow chart for a method to interconnect a first circuit board to a second circuit board with side mounted interconnect points according to one embodiment of the present invention.

FIG. 6 shows a flow chart for a method to interconnect a first circuit board to a second circuit board with side mounted interconnect points according to one embodiment of the present invention. The method 600 includes coupling interconnect points located on a side plane of a first circuit board to interconnect points located on a side plane of a second circuit board. The coupling provides an electrical contact between the first and second circuit boards. The method 600 further includes communicating between components of the first and second circuit board. In one embodiment, communicating includes the exchange of information or data between the first and second circuit board. In another embodiment, communicating includes the supplying of power from one circuit board to the other circuit board.

In one embodiment, the coupling of interconnect points on the first and the second circuit boards occurs without contacting the top or bottom surface of the first circuit board and without contacting the top or bottom surface of the second circuit board. The top surfaces of the first and second circuit boards can be used primarily for mounting or attaching electronic components in order to decrease the size of the circuit boards.

In one embodiment, the method 600 further includes coupling interconnect points located on the side plane of the first circuit board to a first side plane of an elastomeric material in a segmented pattern. The method 600 further includes coupling a second side plane of the elastomeric material to the interconnect points located on the side plane of the second circuit board.

In one embodiment, the first and second circuit boards are main logic boards. In another embodiment, the first and second circuit boards are printed circuit boards.

Using the methods of various embodiments of the present invention, test probes are applied to test points located on at least one side plane of a circuit board. Electronic components of the circuit board are tested by applying electrical signals to the test points that are each coupled to at least one of a plurality of conductive members coupled to the circuit board.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus, comprising:
a circuit board with a top plane, a bottom plane, and a plurality of side planes with at least one side plane having test points to receive test probes, wherein the entire electrical contact surface of at least one of the test points is only on the at least one side plane and only receives at least one of the test probes directly on the at least one side plane;
at least one electronic component coupled to the top plane of the circuit board; and
a plurality of conductive members coupled to the circuit board with at least one conductive member coupled to each test point.

2. The apparatus of claim 1, wherein the test probes and test points are both collinear.

3. The apparatus of claim 1, wherein at least some of the test points are partially recessed from the side planes of the circuit board.

4. The apparatus of claim 1, wherein at least some of the test points lie in the at least one side plane, the top plane, and the bottom plane of the circuit board.

5. The apparatus of claim 1, wherein the test points completely lie in the at least one side plane of the circuit board.

6. The apparatus of claim 1, wherein the surface area of the at least one side plane is less than the surface area of the top plane.

7. The apparatus of claim 1, wherein the at least one side plane extends between the top plane and the bottom plane.

8. The apparatus of claim 1, wherein each conductive member of the plurality of conductive members is protected with a ground shield.

9. The apparatus of claim 1, further comprising:
an elastomeric material coupled to the circuit board; and
an enclosure coupled to the elastomeric material.

10. The apparatus of claim 9, wherein:
the elastomeric material is segmented with alternating conductive and non-conductive layers;
the enclosure is operative to receive the test probes; and
the conductive layers of the elastomeric material are operative to couple the test points of the circuit board to the enclosure.

11. The apparatus of claim 1, further comprising:
an elastomeric material coupled to the circuit board; and
a second circuit board coupled to the elastomeric material.

12. The apparatus of claim 11, wherein:
the elastomeric material is segmented with alternating conductive and non-conductive layers;
the second circuit board comprises a side plane having interconnect points; and
the conductive layers of the elastomeric material are operative to couple the test points of the circuit board to the interconnect points of the second circuit board.

13. An apparatus, comprising:
a first circuit board with a top plane, a bottom plane, and a plurality of side planes;
a second circuit board with a top plane, a bottom plane, and a plurality of side planes, one side plane of the second circuit board having interconnect points coupled to interconnect points of one side plane of the first circuit board; and
at least one electronic component coupled to the top plane of the first circuit board, wherein the entire electrical contact surface for at least a first one of the interconnect points of the one side plane of the first circuit board is only on the one side plane of the first circuit board and only receives an interconnect point of the second circuit board directly on the one side plane of the first circuit board.

14. The apparatus of claim 13, wherein the coupling provides an electrical contact between the first and second circuit boards.

15. The apparatus of claim 13, wherein the coupling of the first and second circuit boards occurs without contacting the top or bottom surface of either the first or second circuit board.

16. The apparatus of claim 13, further comprising an elastomeric material to couple the interconnect points of the first and second circuit board.

17. The apparatus of claim 13, wherein the surface area of the one side plane of the first circuit board is less than the surface area of the top plane of the first circuit board.

18. The apparatus of claim 13, wherein the surface area of the one side plane of the second circuit board is less than the surface area of the top plane of the second circuit board.

19. The apparatus of claim 13, wherein the one side plane of the first circuit board extends between the top plane of the first circuit board and the bottom plane of the first circuit board.

20. The apparatus of claim 13, wherein the one side plane of the second circuit board extends between the top plane of the second circuit board and the bottom plane of the second circuit board.

* * * * *